United States Patent
Hata et al.

(10) Patent No.: US 7,468,235 B2
(45) Date of Patent: Dec. 23, 2008

(54) BARRIER COATING COMPOSITIONS CONTAINING FLUORINE AND METHODS OF FORMING PHOTORESIST PATTERNS USING SUCH COMPOSITIONS

(75) Inventors: Mitsuhiro Hata, Suwon-si (KR); Sang-Jun Choi, Seoul (KR); Man-Hyoung Ryoo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 11/447,907

(22) Filed: Jun. 7, 2006

(65) Prior Publication Data

US 2007/0048671 A1 Mar. 1, 2007

(30) Foreign Application Priority Data

Aug. 30, 2005 (KR) ........................ 10-2005-0079953

(51) Int. Cl.
*G03C 5/00* (2006.01)
*G03C 1/76* (2006.01)
*G03F 7/00* (2006.01)

(52) U.S. Cl. .............. 430/270.1; 430/914; 430/287.1; 430/281.1; 430/322; 430/449; 526/281; 526/271; 522/121; 522/125; 522/114

(58) Field of Classification Search ............. 430/270.1, 430/914, 287, 281, 322; 526/281, 271; 522/121, 522/125, 114
See application file for complete search history.

(56) References Cited

U.S. PATENT DOCUMENTS

| | | | | |
|---|---|---|---|---|
| 5,445,919 | A * | 8/1995 | Wakata et al. | 430/287.1 |
| 6,277,538 | B1 * | 8/2001 | Choi et al. | 430/270.1 |
| 6,517,990 | B1 * | 2/2003 | Choi et al. | 430/270.1 |
| 2004/0259025 | A1 * | 12/2004 | Barclay et al. | 430/270.1 |
| 2005/0042554 | A1 | 2/2005 | Dierichs et al. | 430/322 |
| 2005/0202351 | A1 * | 9/2005 | Houlihan et al. | 430/322 |

FOREIGN PATENT DOCUMENTS

| | | |
|---|---|---|
| JP | 2005-099646 | 4/2005 |
| JP | 2005-099648 | 4/2005 |

OTHER PUBLICATIONS

Ralph R. Dammel et al., *193 nm Immersion Lithography—Taking the Plunge*, J. of Photopolymer Science and Technology, 2004, vol. 17, No. 4, pp. 587-602.

* cited by examiner

*Primary Examiner*—Cynthia H Kelly
*Assistant Examiner*—Ponder N Thompson Rummel
(74) *Attorney, Agent, or Firm*—Harness, Dickey & Pierce, P.L.C.

(57) ABSTRACT

Provided are a barrier coating composition and a method of forming photoresist pattern by an immersion photolithography process using the same. The barrier coating composition includes a polymer corresponding to formula I having a weight average molecular weight (Mw) of 5,000 to 100,000 daltons and an organic solvent,

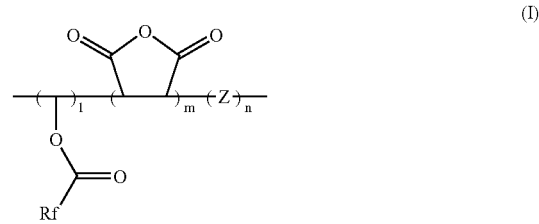

(I)

wherein the expressions $1+m+n=1$; $0.1 \leq 1/(1+m+n) \leq 0.7$; $0.3 \leq m/(1+m+n) \leq 0.9$; and $0.0 \leq n/(1+m+n) \leq 0.6$ are satisfied; Rf is a $C_1$ to $C_5$ fluorine-substituted hydrocarbon group; and Z, if present, includes at least one hydrophilic group. Compositions according to the invention may be used to form barrier layers on photoresist layers to suppress dissolution of photoresist components during immersion photolithography while allowing the barrier layer to be removed by alkaline developing solutions.

14 Claims, 4 Drawing Sheets

BARRIER COATING COMPOSITIONS CONTAINING FLUORINE AND METHODS OF FORMING PHOTORESIST PATTERNS USING SUCH COMPOSITIONS

PRIORITY STATEMENT

This application claims the benefit priority under 35 U.S.C. § 119 from Korean Patent Application No. 10-2005-0079953, which was filed on Aug. 30, 2005, in the Korean Intellectual Property Office, the disclosure of which is incorporated herein, in its entirety, by reference.

BACKGROUND OF THE INVENTION

1. Field of the Invention

Embodiments of the invention include polymeric compounds, and compositions including such compounds, that may be used in forming barrier coating layers for protecting underlying photoresist compositions and methods of utilizing such compounds and compositions. For example, compounds and compositions according to example embodiments of the invention may be used in manufacturing semiconductor integrated circuits, particularly with respect to methods for forming photoresist layers and patterns having a barrier coating layer that will improve the performance of the photoresist in, for example, immersion photolithography.

2. Description of the Related Art

In fabrication processes for manufacturing semiconductor devices, photolithographic processes are used repeatedly to form a wide variety of patterns. The smallest lines and spaces that can be formed using a particular photolithographic process are limited, to some degree, by the wavelength of the light used to expose the pattern. For example, line patterns on the order of about 60 nm represent a lower limit to the patterns that can be produced using a conventional ArF laser (193 nm) light source.

Immersion photolithography processes have been suggested as alternatives to the conventional lithographic processes that can overcome the wavelength limitations associated with the conventional use of ArF laser light sources. In immersion photolithography processes, the gap or space formed between a lens and the wafer surface is filled with liquid that enhances the system performance.

In photolithography processes, the numeral aperture (NA) of an exposure system can be calculated from the equation:

$$NA = n \sin(\alpha)$$

in which n is the refractive index (RI) of an immersion medium and a is the angle between the optical axis of the system and light entering an object lens farthest from the optical axis. In general, a larger NA and/or a light source having a shorter wavelength will tend to improve the resolution that can be obtained by the imaging system. Because the immersion medium used in immersion photolithography tends to increase the NA to a value greater than 1, for example, achieving NA values greater than or equal to 1.3, the resolution of the imaging system may be increased. In particular, when $H_2O$ is used as the immersion medium, improved resolution and improved depth of focus (DOF) can be achieved when compared with a conventional "dry" photolithographic process using can be attained by utilizing the refractive index, n=1.44, of water.

However, using $H_2O$ as an immersion liquid can lead to several problems including, for example, the tendency of photoresist components such as photoacid generators (PAG) and/or bases to leach into water from the photoresist, thereby compromising the performance of the photoresist and/or contaminating the lens. One method for addressing this problem involves forming a barrier coating layer on the photoresist as disclosed in, for example, by R. R. Dammel et al. in *J. Photopol. Sci. Tech.*, 587, 4 (2004), the disclosure of which is hereby incorporated, in its entirety, by reference. The barrier coating layer prevents or reduces contact between the immersion medium and the photoresist, thus preventing or reducing the likelihood that one or more of the photoresist components will be leached from the photoresist layer.

Barrier coating compositions for use in immersion photolithography processes should exhibit relatively low solubility in the immersion medium for at least the duration of the exposure process, exhibit relatively low absorbance at the wavelength of the exposure light source, exhibit relatively good solubility in a developing solution after being exposed, and should exhibit no more than minor intermixing with the photoresist layer to which it is applied.

SUMMARY OF THE INVENTION

Example embodiments of the invention include barrier compositions that exhibit reduced aqueous solubility, exhibit little, if any, intermixing with photoresist compositions when applied to the surface of a photoresist layer, exhibit relatively low absorbance at the UV wavelengths used for exposing the photoresist layer and are readily soluble in developing solutions after being exposed during an immersion photolithography process. As used herein, the term readily soluble is intended to encompass materials that can be substantially completely removed from the surface of the substrate during a developing operation that includes exposing the material layer to a conventional removing solution or developing solution, for example, water or an aqueous alkaline solution of 2.38 wt % TMAH, for a relatively brief period, for example 30 to 60 seconds. As will be appreciated by those skilled in the art, however, a number of variables, for example, the thickness of the layer, previous heat treatment of the layer, the temperature of the developing solution and/or the application rate of the developing solution may affect the rate at which the material is removed from the substrate and, consequently, the actual development time required for complete removal.

Example embodiments of the invention also include methods of forming photoresist layers suitable for use in immersion photolithography processes for producing fine patterns exhibiting good pattern profiles can be formed with a simple and economical manufacturing process.

Example embodiments of the invention also include a range of polymer structures suitable for inclusion in the barrier compositions in combination with a suitable solvent or solvent system. These polymers exhibit a weight average molecular weight (Mw) of 5,000 to 100,000 daltons and may be generally represented by formula I:

wherein the expressions $(1+m+n)=1$; $0.1 \leq (1/(1+m+n)) \leq 0.7$; $0.3 \leq (m/(1+m+n)) \leq 0.9$; $0.0 \leq (n/(1+m+n)) \leq 0.6$ are satisfied; Rf is a $C_1$ to $C_5$ fluorine-substituted hydrocarbon group; and Z is a monomer that includes at least one hydrophilic group. For example, polymers in which the distribution of the monomers satisfies the expressions $0.2 \leq (1/(1+m+n)) \leq 0.5$; $0.3 \leq (m/(1+m+n)) \leq 0.8$; and $0.0 \leq (n/(1+m+n)) \leq 0.6$ may be particularly useful. The polymers may also be characterized by a polydispersity of no greater than 3, but polymers having higher degrees of polydispersity may still exhibit satisfactory performance.

The hydrophilic group(s) included on Z may be selected from a group consisting of alcohol groups and acid groups, for example, a carboxy group and a sulfonic group. Z may be a monomer selected from the group consisting of (meth) acrylates, cycloalkenes, (meth)acrylic acids, pyran derivatives exhibiting hydrophilic properties including, for example, 3,4, dihydropyran and pyran derivatives that include one or more polar groups, furan derivatives, for example 2,3-dihydrofuran-2-carboxylic acid, allyl alcohols and norbornene derivatives, for example, 5-norbornene-2-methanol.

The organic solvent may be selected from a group consisting of $C_3$ to $C_{10}$ alcohol-based organic solvents, $C_4$ to $C_{12}$ alkane-based organic solvents and mixtures and combinations thereof.

Example embodiments of the invention also include methods of forming photoresist patterns including: forming a photoresist layer on a substrate; soft-baking the photoresist layer at a first temperature; forming a barrier coating layer by coating the soft-baked photoresist layer with a quantity of a barrier coating composition according to an example embodiment of the invention which including one or more polymers according to example embodiments of the invention and an organic solvent or organic solvent system, wherein the polymer is expressed by formula I:

(I)

wherein the expressions $(1+m+n)=1$; $0.1 \leq (1/(1+m+n)) \leq 0.7$; $0.3 \leq (m/(1+m+n)) \leq 0.9$; and $0.0 \leq (n/(1+m+n)) \leq 0.6$ are satisfied; Rf represents a $C_1$ to $C_5$ fluorine-substituted hydrocarbon group; and Z is an optional monomer that includes at least one hydrophilic group; exposing a region of the photoresist layer to light energy transmitted through both a liquid medium and a barrier coating layer arranged over an underlying photoresist layer to form an exposed photoresist layer; performing a post-exposure baking (PEB) of the exposed photoresist layer; removing the barrier coating layer; and developing the exposed photoresist layer.

The barrier coating layer may be formed by spin-coating a barrier coating composition on the photoresist layer and then heat-treating the spin-coated barrier coating composition. The steps of removing the barrier coating layer and developing the exposed photoresist layer may be performed in a single step.

Example embodiments of the invention include methods of forming barrier coating layers from barrier coating compositions that include one or more polymers selected from fluorine-containing monomers, a furan-derivative monomer, for example, furan-2,5-dione (as shown), and, optionally, an alkene or heterocyclic monomer that includes at least one hydrophilic group, for example, a norbornene derivative or an unsaturated alcohol. The barrier coating layers formed according to the example embodiments of the invention may be utilized as a dissolution barrier during immersion photolithography to suppress or eliminate the movement of soluble components from the photoresist into the liquid medium while the photoresist is being exposed using immersion photolithography. The barrier coating layers according to the example embodiments of the invention will also exhibit little, if any, intermixing with the liquid medium or the underlying photoresist layer during photolithography.

Barrier coating layers formed using barrier coating compositions according to example embodiments of the invention has a good solubility to a developing solution after exposure. Therefore, the method of forming a photoresist pattern by an immersion photolithography process using the barrier coating composition according to the invention can easily form fines pattern having a good profiles through relatively simple process modifications and without requiring the use of unduly expensive materials or equipment.

BRIEF DESCRIPTION OF THE DRAWINGS

The features and scope of the invention will become more apparent in light of the detailed discussion of example embodiments provided below with reference to the attached drawings in which.

The drawings provided in FIGS. 1A-1E are for illustrative purposes only and are not drawn to scale. The spatial relationships and relative sizing of the elements illustrated in the various embodiments, for example, the various films and layers comprising the semiconductor device may have been reduced, expanded or rearranged to improve the clarity of the figure with respect to the corresponding description. These figures, therefore, should not be interpreted as accurately reflecting the relative sizing, value or positioning of the corresponding structural elements that could be encompassed by actual semiconductor devices manufactured according to the example embodiments of the invention.

DETAILED DESCRIPTION OF EXAMPLE EMBODIMENTS

Barrier coating compositions according to example embodiments of the invention may be used to form barrier coating layers on photoresist layers for suppressing or preventing the leaching of photoresist components from the photoresist layer into an immersion medium during immersion photolithography. Barrier coating compositions according to example embodiments of the invention include at least one polymer having a weight average molecular weight (Mw) of 5,000 to 100,000 daltons and an organic solvent. The polymer may be represented by formula I:

(I)

wherein the expressions $(1+m+n)=1$; $0.1 \leq (1/(1+m+n)) \leq 0.7$; $0.3 \leq (m/(1+m+n)) \leq 0.9$; and $0.0 \leq (n/(1+m+n)) \leq 0.6$ are satisfied; Rf is a $C_1$ to $C_5$ fluorine-substituted hydrocarbon group; and Z is a monomer that includes a hydrophilic group. For example, polymers in which the distribution of the monomers satisfies the expressions $0.2 \leq (1/(1+m+n)) \leq 0.5$; $0.3 \leq (m/(1+m+n)) \leq 0.8$; and $0.0 \leq (n/(1+m+n)) \leq 0.6$ may be particularly useful.

Rf may be a perfluorohydrocarbon group, for example, a trifluoromethyl group. One or more Z monomers may be utilized for increasing the relative solubility of barrier coating layers formed from barrier coating compositions according to the example embodiments of the invention, particularly with respect to solubility in aqueous alkaline developing solutions. The Z monomer will typically include at least one hydrophilic group, for example, an alcohol group or an acid group, e.g., a carboxy group and a sulfonic group. For example, the Z monomer(s), if present, may be selected from a group consisting of (meth)acrylates, alkenes, cycloalkenes, heterocyclic compounds and (meth)acrylic acid and mixtures and derivatives thereof. The Z monomer(s) may be selected from, for example, a group consisting of 4- to 6-member ring heterocyclic compounds, for example, pyran derivatives, particularly those pyran derivatives including a polar group, allyl alcohol and norbornene derivatives including, for example, 5-norbornene-2-methanol.

Barrier coating compositions according to example embodiments of the invention will also include at least one organic solvent for dissolving the polymer(s). This organic solvent may be a single alcohol-based organic solvent, an alkane-based organic solvent or a mixture of alcohol-based organic solvent(s) and/or alkane-based organic solvent(s). For example, solvent systems may include a mixture of $C_3$ to $C_{10}$ alcohol-based organic solvents, a mixture of $C_4$ to $C_{12}$ alkane-based organic solvent, or a mixture of one or more $C_3$ to $C_{10}$ alcohol-based organic solvents and one or more $C_4$ to $C_{12}$ alkane-based organic solvents.

Solvent systems useful for use with polymers according to example embodiments of the invention may also include one or more additional components selected from a group consisting of alkanes, nitryls, and/or ethers, particularly in combination with an alcohol-based organic solvent or solvent system. Other components of the barrier coating composition may include one or more viscosity modifiers, fluorine-based surfactants, silicon-based surfactants, ionic surfactants and/or non-ionic surfactants to obtain an acceptable range of composition parameters and layer uniformity.

When a mixture of at least one alcohol-based organic solvent and at least one alkane-based organic solvent is used as an organic solvent system in a barrier coating composition according to an example embodiment of the invention, the amount of the alkane-based organic solvent will typically comprise less than 50 wt % of the organic solvent and may account for less than about 30 wt % based on the total weight of the organic solvent. Representative examples of alcohol-based organic solvents that are expected to be suitable for the barrier coating composition include both isopropyl alcohol and 4-methyl-2-pentanol while representative examples of alkane-based solvents suitable for the barrier coating composition include both nonane and decane.

When forming a photoresist pattern using immersion photolithography, a barrier coating layer is formed on an underlying photoresist layer using a barrier coating composition according to an example embodiment of the invention. The barrier coating layer will tend to suppress or prevent leaching of various photoresist components, for example, a photoacid generator (PAG), into a liquid medium, for example, water, that is disposed between a lower surface of a lens system and an upper surface of the barrier coating layer. An example embodiment of a method of forming a photoresist pattern using a barrier coating composition according to an example embodiment of the invention is described below.

Figure 1A:
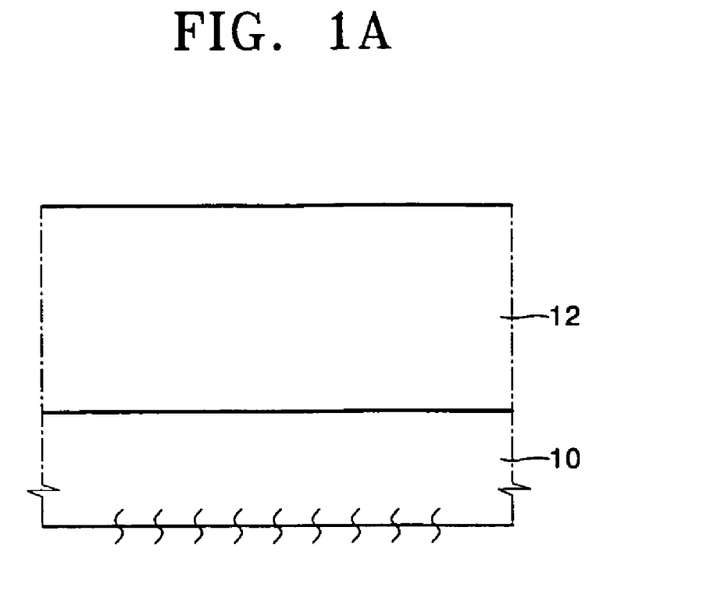
FIGS. 1A through 1E are sectional views for illustrating a method of forming a photoresist pattern according to an example embodiment of the invention.

FIGS. 1A through 1E are sectional views for illustrating a method of forming a photoresist pattern according to an example embodiment of the invention. As illustrated in FIG. 1A, a photoresist layer 12 may be formed on a semiconductor substrate 10 using a conventional chemically amplified photoresist composition, either positive or negative photoresist, that contains at least one photo acid generator (PAG). The chemically amplified resist composition may, for example, be a photoresist composition configured for exposure using light energy having a wavelength produced using a KrF excimer laser (248 nm), an ArF excimer laser (193 mm) or a $F_2$ excimer laser (157 nm).

The photoresist layer 12 formed on the semiconductor substrate 10 may then be heated to a temperature and for a time period sufficient to achieve a "soft" baked condition. For example, a conventional photoresist may be soft-baked at a temperature of, for example, about 105° C. to 130° C., or may be otherwise treated to fix the dimensions of the photoresist layer and/or harden at least an upper portion of the photoresist.

Figure 1B:
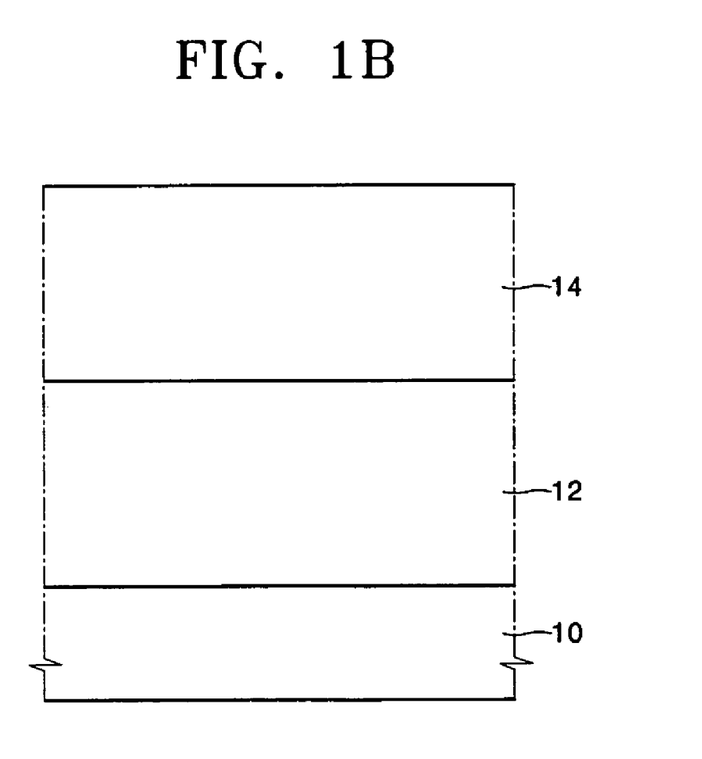
Figure 1C:
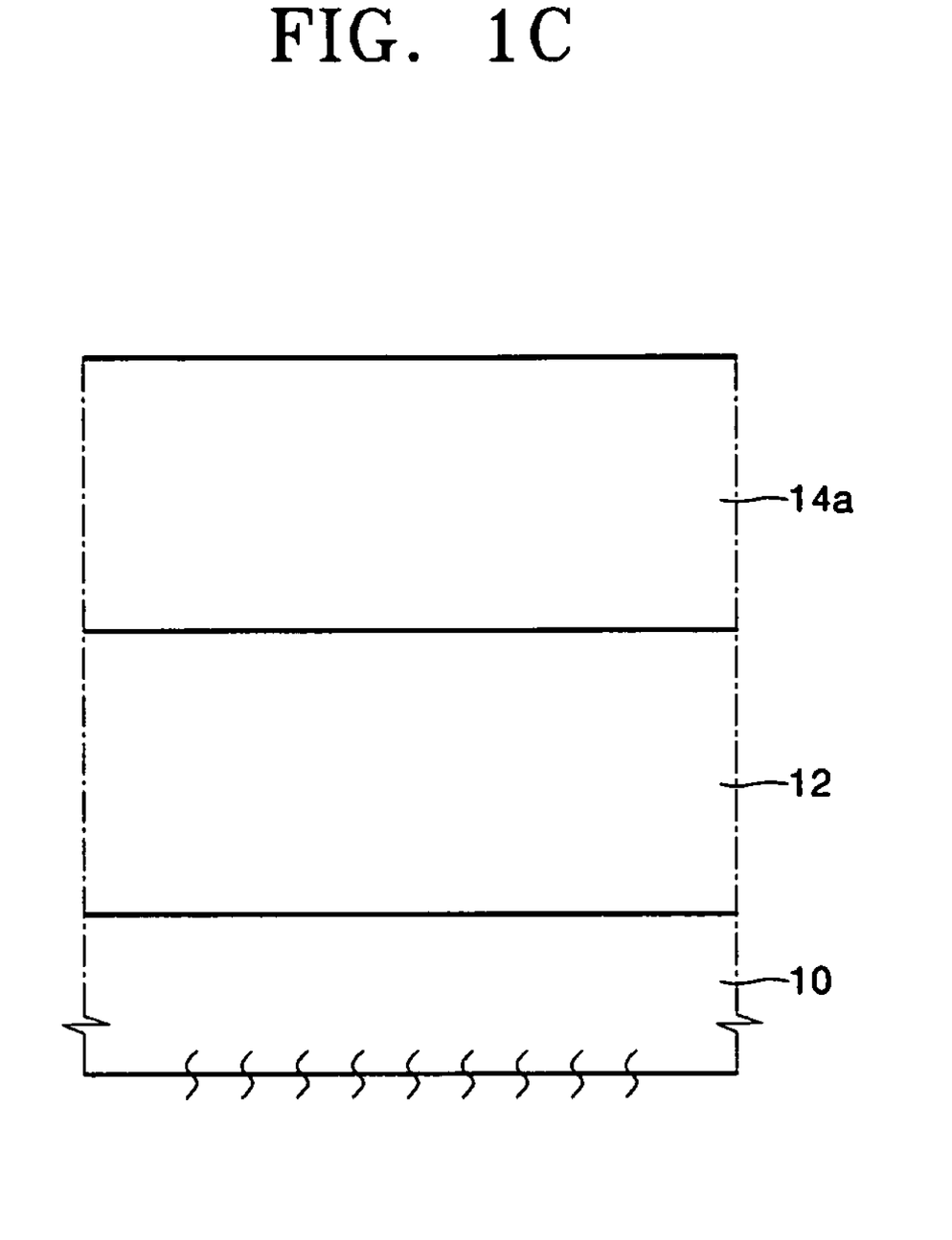
Figure 1D:
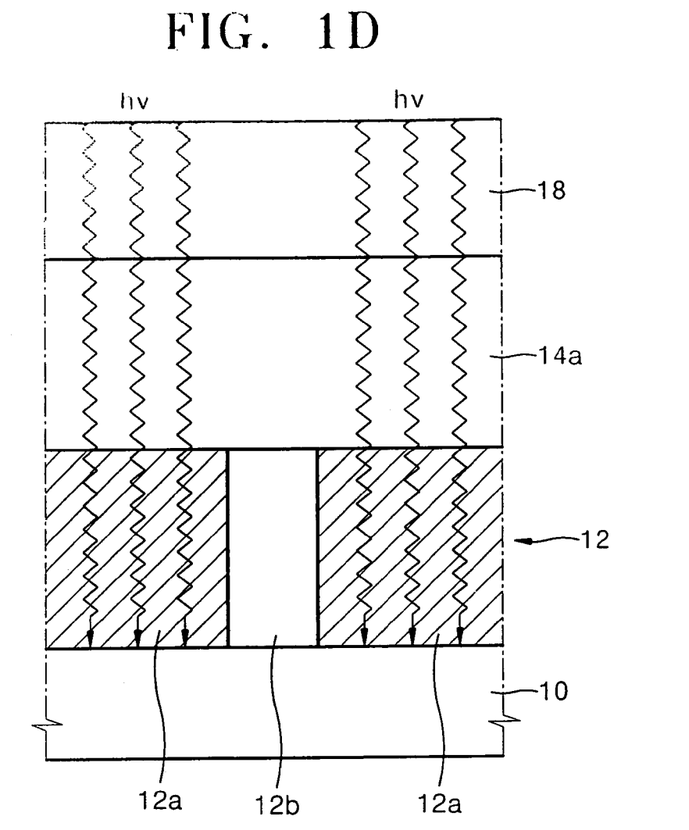

As illustrated in FIG. 1B, the photoresist layer 12 may be applied using a conventional application method, e.g., spin-coating, using a barrier coating composition according to an example embodiment of the invention, to form a layer of the barrier coating composition 14 across the surface of the photoresist. A spin-coating process may, for example, include dispensing a quantity of the barrier coating composition onto the upper surface of the photoresist layer 12, after which the substrate is spun at 500 to 3000 rpm for 30 to 90 second to spread the barrier coating composition across the entire upper surface of the photoresist to form a generally uniform layer. As will be appreciated by those skilled in the art, the particular parameters used for conducting the spin-coating process, as well as other conventional application processes, will depend on the characteristics of the barrier coating composition, e.g., viscosity, and the final thickness intended for the barrier coating layer. As illustrated in FIG. 1C, the semiconductor substrate 10 on which the layer of barrier coating composition 14 has been formed may then be heat-treated to form a barrier coating layer 14a. The heat treatment, for example, be performed at a temperature of from about 95° C. to 120° C. As illustrated in FIG. 1D, one or more portions of the photoresist layer 12 may then be exposed by transmitting light energy from a light source (not shown), for example, an ArF excimer laser (193 nm), through a lens system and through both a liquid medium 18 and the barrier coating layer 14a provided on the photoresist layer 12. The light energy entering the photoresist layer will induce chemical changes in the photoresist and produce an exposed photoresist layer that includes both exposed regions 12a and unexposed regions 12b.

The liquid medium 18 may be, for example, water, in which case the barrier coating layer 14a interposed between the photoresist layer 12 and the liquid medium 18 suppresses or prevents dissolution or leaching of photoresist components from the photoresist layer 12 into the liquid medium 18.

Figure 1E:
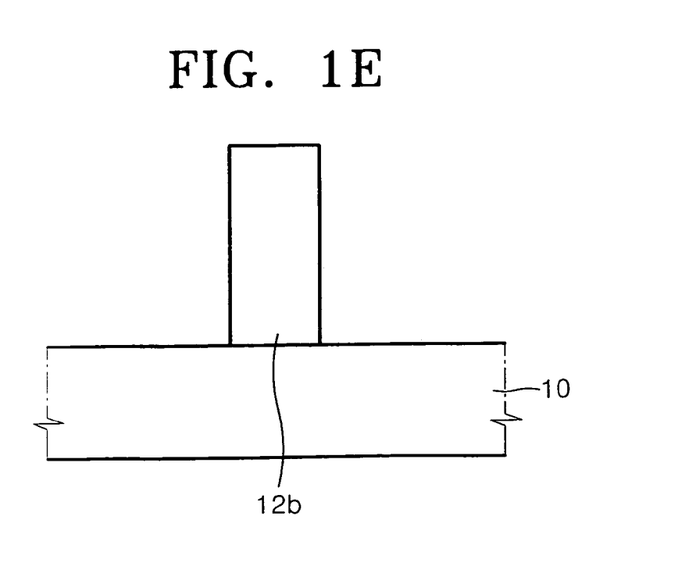

As illustrated in FIG. 1E, after the exposure process using the liquid medium 18 is completed, the exposed photoresist layer 12 may be subjected to post-exposure baking (PEB) process to promote or enhance the chemical changes within the photoresist initiated by the exposure. The barrier coating layer 14a is then removed and the exposed photoresist layer 12 is developed to obtain a photoresist pattern. Barrier coating layers 14a made from barrier coating compositions according to example embodiments of the invention will exhibit increased solubility in the developing solution, for example, an alkaline developing solution, relative to the solubility exhibited in the immersion medium.

Accordingly, it may be unnecessary to perform a separate process for removing the barrier coating layer 14a in those situations in which the barrier coating layer can be readily and substantially completely removed using the developing solution by simply increasing the time period during which a developing solution, that is also suitable for developing the exposed photoresist layer 12, is applied to the substrate. A suitable alkaline developing solution may be, for example, a 2.38% tetramethylammonium hydroxide (TMAH) solution. As will be appreciated by those skilled in the art, the barrier coating layer may be removed at a higher rate using a "removing" solution that differs somewhat in composition, temperature and/or application rate and conditions, from the developing solution and conditions that will subsequently be utilized to develop the exposed photoresist layer. As will also be appreciated by those skilled in the art, removing the barrier coating layer using the basic photoresist developing process, although conducted for an extended period in order to remove the additional barrier coating layer material, may be easily implemented on the same developing equipment.

After the developing process is completed, during which the barrier coating layer 14a and the exposed region(s) 12a of the photoresist layer 12 have been removed, the remaining unexposed region(s) 12b of the photoresist layer 12 form a photoresist pattern on the semiconductor substrate 10 when the photoresist layer 12 is a positive resist composition. This result is illustrated in FIG. 1E wherein the photoresist pattern, i.e., the remaining portion, corresponds to the non-exposed region 12b. However, this particular example should not be deemed to limit the scope of the invention. Indeed, as will be appreciated by those skilled in the art, if the photoresist layer 12 was formed from a negative resist composition, only the exposed region(s) 12a would remain on the semiconductor substrate 10 (not shown) after developing the photoresist pattern.

In addition to the detailed explanation provided above and as illustrated in FIGS. 1A-1E, certain example embodiments and comparative data are provided below to amplify the detailed description and provide certain representative examples whereby the scope and application of the invention may be more fully appreciated. As will be appreciated by those skilled in the art, the inventions described herein may be embodied in many different forms and should not be construed as being limited to the example embodiments set forth herein. These embodiments are provided so that this disclosure will provide a thorough and complete description of the inventions and will fully convey the invention to those skilled in the art.

Example 1

Polymerizing Fluorine-Containing Polymer (1)

(1)

1.4 g (10 mmol) of vinyltrifluoroacetate (obtained from Aldrich Chemical), 1.0 g (10 mmol) of maleic anhydride, and 4 mol % of azobisisobutyronitrile (AIBN) were dissolved in 5 ml of anhydrous THF in a round bottom flask, and then, purged using nitrogen gas. The mixture was then polymerized at about 65° C. under nitrogen for 12 hours.

After polymerization, the polymerized materials were slowly precipitated in an excess amount of n-hexane solution, and then filtered to separate the precipitated product, i.e., the retentate. The polymeric retentate was then dried at about 50° C. for about 24 hours in a vacuum oven. The calculated polymerization yield was 55% with the resulting polymeric material exhibiting a weight average molecular weight (Mw) of 5,800 daltons and a polydispersity (Mw/Mn) of 2.0.

Example 2

Polymerizing Fluorine-Containing Polymer (2)

(2)

2.2 g (15 mmol) of vinyltrifluoroacetate (obtained from Aldrich Chemical), 2.0 g (20 mmol) of maleic anhydride, 0.5 g (5 mmol) of 3,4-dihydro-pyran, and 4 mol % of AIBN were dissolved in 15 ml of anhydrous THF in a round bottom flask, and then, purged using nitrogen gas. The mixture was then polymerized at about 65° C. under nitrogen for 12 hours.

After polymerization, the polymerized materials were slowly precipitated in an excess amount of a solution of 1:1 mixture of n-hexane:IPA. The precipitate was then dried at about 50° C. for about 24 hours in a vacuum oven. The calculated polymeric yield was 60% with the resulting polymeric material exhibiting a weight average molecular weight (Mw) of 7,500 daltons and a polydispersity (Mw/Mn) of 2.0.

Example 3

Polymerizing fluorine-containing polymer (3)

(3)

2.2 g (15 mol) of vinyltrifluoroacetate (obtained from Aldrich Chemical), 2.0 g (20 mmol) of maleic anhydride, 0.7 g (5 mmol) of 5-norbornene-2-methanol, and 4 mol % of AIBN were dissolved in 15 ml of anhydrous THF in a round bottom flask, and then, purged using nitrogen gas. The mixture was polymerized at about 65° C. under nitrogen for 12 hours.

After polymerization, the polymerized materials were slowly precipitated in an excess amount of n-hexane solution. The precipitate was then dried at about 50° C. for about 24 hours in a vacuum oven. The calculated polymeric yield was 45% with the resulting polymeric material exhibiting a weight average molecular weight (Mw) of 8,500 daltons and a polydispersity (Mw/Mn) of 2.0.

Example 4

Polymerizing Fluorine-Containing Polymer (4)

(4)

16 mmol of vinyltrifluoroacetate (obtained from Aldrich Chemical), 20 mmol of maleic anhydride, 4 mmol of allyl alcohol, and 4 mol % of AIBN were dissolved in 5 ml of anhydrous THF in a round bottom flask, and then, purged using nitrogen gas. The mixture was then polymerized at about 65° C. under nitrogen for 12 hours.

After polymerization, the polymerized materials were slowly precipitated in an excess amount of n-hexane solution. The precipitate was then dried at about 50° C. for about 24 hours in a vacuum oven. The calculated polymeric yield was 40% with the resulting polymeric material exhibiting a weight average molecular weight (Mw) of 8,300 daltons and a polydispersity (Mw/Mn) of 2.0.

Example 5

Polymerizing Fluorine-Containing Polymer (5)

(5)

18 mmol of vinyltrifluoroacetate (obtained from Aldrich Chemical), 20 mmol of maleic anhydride, 2 mmol of acrylic acid, and 4 mol % of AIBN were dissolved in 10 ml of anhydrous THF in a round bottom flask, and then, purged using nitrogen gas. The mixture was then polymerized at about 65° C. under nitrogen for 12 hours.

After polymerization, the polymerized materials were slowly precipitated in an excess amount of n-hexane solution. The precipitate was then dried at about 50° C. for about 24 hours in a vacuum oven. The calculated polymeric yield was 50% with the resulting polymeric material exhibiting a weight average molecular weight (Mw) of 7,700 daltons and a polydispersity (Mw/Mn) of 2.0.

Example 6

Barrier Characteristics of Barrier Coating Layer (1)

A photoresist pattern was formed using an immersion photolithography process using a barrier coating layer formed using a barrier coating composition according to an example embodiment of the invention that include as its polymeric component the polymer product of Example 1. Various barrier characteristics of the barrier coating layer were then measured in conjunction with a simulated immersion photolithography process. The simulated immersion photolithography exposure process was conducted by immersing the coated substrates in 25° C. deionized water for 60 seconds, dry-exposing the coated substrates, and then again immersing the coated and exposed substrates in 25° C. deionized water for another 60 seconds. This simulated immersion photolithography exposure process was used for evaluating each of the other examples described below unless different conditions are specifically noted.

Anti-reflective coating (ARC) material (AR 46™ manufactured by Rohm-Hass) for an exposure wavelength of 193 nm was spin-coated on an 8 inch (20.3 cm) diameter bare silicon wafer, and then baked to form an ARC layer with a thickness of about 290 Å. Then, a photoresist (RHR3640™ manufactured by ShinEstu) intended for use with light sources generating light energy having an exposure wavelength of 193 nm was spin-coated on the ARC layer, and then baked at 110° C. for 60 seconds to obtain a photoresist layer with a thickness of about 1800 Å.

1 g of the polymeric product prepared in Example 1 was dissolved in 50 g of isopropyl alcohol, and then filtered using a 0.2 μm membrane filter, to prepare a first example embodiment of a barrier coating composition according to the invention. This barrier coating composition was then spin-coated at 2000 rpm onto the upper surface of the previously formed photoresist layer to obtain layer of the barrier coating composition. This layer of the barrier coating composition was then heat-treated at about 90° C. for about 60 seconds to form a barrier coating layer having a thickness of about 400 Å.

The upper surface of the wafer, i.e., the upper surface of the barrier coating layer, was soaked in deionized water for 60 seconds, exposed to light radiation from an ArF excimer laser using an AMSL1100 ArF scanner (NA=0.75 annular and σ=0.85/0.55), soaked in deionized water for 60 seconds, subjected to PEB at 110° C. for 90 seconds, and then developed with a 2.38% tetramethylammonium hydroxide (TMAH) solution for 60 seconds. As a result, a clean line and space pattern (L/S pattern) having vertical or substantially vertical walls that did not exhibit a "T-top" profile, i.e., a profile in which an upper portion of the photoresist pattern is enlarged relative to the lower portion of the photoresist pattern, was obtained with a dose was 24 mJ/cm$^2$. The width of the line was 90 nm.

Example 7

Barrier Characteristics of Barrier Coating Layer (2)

Using the same conditions as detailed in connection with Example 6, L/S patterns were formed on silicon wafers using 1 g of the polymeric product according to Example 2 that had been dissolved in 50 g of 4-methyl-2-pentanol and filtered using a 0.2 μm membrane filter to prepare a second example embodiment of a barrier coating composition. After the barrier coating composition had been applied to the upper surface of the photoresist, the wafer, and the material layers provided thereon, were then heated at about 120° C. during a PEB to form a barrier coating layer.

Figure 2:
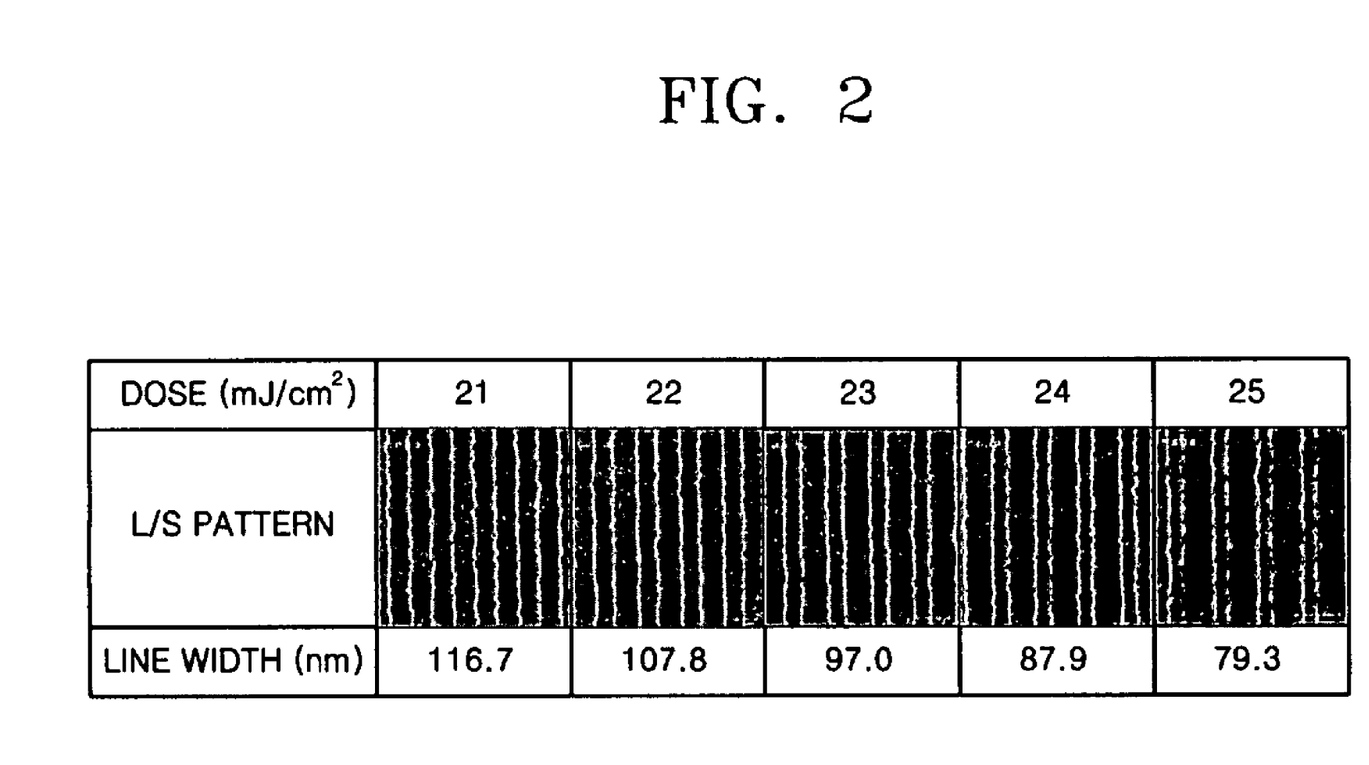
FIG. 2 is a scanning electron microscopy (SEM) image showing photoresist patterns when doses are variously used, according to an example embodiment of the invention.

FIG. 2 illustrates SEM images of L/S patterns obtained on sample wafers having a barrier coating layer formed using the second example embodiment of the barrier coating composition when various exposure doses were used. As illustrated in FIG. 2, clean L/S patterns having various line widths from about 120 nm to about 80 nm obtained using doses ranging from 21 to 25 mJ/cm².

Example 8

Barrier Characteristics of Barrier Coating Layer Layer (3)

Using the same conditions as in Example 6, L/S patterns were formed on silicon wafers, with the exception that the barrier coating composition was prepared using 1 g of the polymeric material produced in Example 3 above. This polymeric material was dissolved in 50 g of 4-methyl-2-pentanol and then filtered using a 0.2 μm membrane filter to obtain a second example embodiment of a barrier coating composition according to the invention.

As a result, a clean L/S pattern having vertical or substantially vertical walls that did not exhibit a T-top profile using an exposure dose of 24 mJ/cm². The width of the line was 90 nm.

Example 9

Barrier Characteristics of Barrier Coating Layer Layer (4)

Using the same conditions as in Example 6, L/S patterns were formed on silicon wafers, with the exception that 1 g of the polymeric material prepared according to Example 4 was dissolved in 50 g of 4-methyl-2-pentanol and then filtered using a 0.2 μm membrane filter to obtain a third example embodiment of a barrier coating composition according to the invention.

As a result, a clean L/S pattern having vertical or substantially walls that did not exhibit a T-top profile was obtained using an expose dose of 25 mJ/cm². The width of the line was 90 nm.

Example 10

Barrier Characteristics of Barrier Coating Layer Layer (5)

Using the same conditions as in Example 6, L/S patterns were formed on silicon wafers, with the exception that 1 g of the polymeric material prepared according to Example 5 was dissolved in 50 g of 4-methyl-2-pentanol and then filtered using a 0.2 μm membrane filter to obtain a fifth example embodiment of a barrier coating composition according to the invention.

As a result, a clean L/S pattern having vertical or substantially vertical walls that does not exhibit a T-top profile was obtained using an exposure dose of 24 mJ/cm². The width of the line was 90 nm.

The barrier coating composition according to the invention includes at least first fluorine-containing monomer and a second furan derivative monomer, for example, maleic anhydride (i.e., furan-2,5-dione). As a result of the fluorine present in the first monomer, barrier coating compositions according to the invention will typically exhibit relatively high hydrophobicity. Barrier coating layers formed using barrier coating compositions according to the example embodiments of the invention may be used as barrier layers during immersion photolithography that will suppress or prevent the dissolution of photoresist components into the liquid medium used during the immersion photolithography.

The barrier coating compositions according to the invention and barrier coating layers prepared from such compositions will also typically exhibit little, if any, intermixing with the photoresist layer during barrier coating layer formation or with the liquid medium during a subsequent immersion photolithography process. Barrier coating layers formed using the barrier coating compositions according to the invention will also be relatively insoluble in the liquid medium while being relatively soluble in a developing solution applied to the barrier coating layer after exposure. Accordingly, methods of forming a photoresist pattern using an immersion photolithography process in which the photoresist layer is protected by a barrier coating layer formed using a barrier coating composition according to the invention can form fine photoresist patterns that exhibit good profiles. Further, these fine patterns can be achieved through relatively simple process modifications and without requiring the use of unduly expensive materials or equipment.

While the invention has been particularly shown and described with reference to certain example embodiments thereof, it will be understood by those of ordinary skill in the art that various changes in form and details may be made therein without departing from the spirit and scope of the invention as defined by the following claims.

What is claimed is:

1. A barrier coating composition for immersion photolithography comprising:
  a polymer having a weight average molecular weight (Mw) of 5,000 to 100,000 daltons; and
  an organic solvent,
  wherein the polymer is represented by formula I:

(I)

wherein the expressions $(l+m+n)=1$; $(0.1 \leq l/(1+m+n)) \leq 0.7$; $0.3 \leq (m/(1+m+n)) \leq 0.9$; and $0.0 \leq 1 \leq (n/(1+m+n)) \leq 0.6$ are satisfied;
  Rf is selected from a group consisting of $C_1$ to $C_5$ fluorine-substituted hydrocarbon group; and
  Z is 5-norbornene-2-methanol.

2. The barrier coating composition according to claim 1, wherein:
  Rf is selected from a group consisting of a perfluorohydrocarbon group, a trifluoromethyl group and mixtures thereof.

3. The barrier coating composition according to claim 1, wherein:
  the organic solvent is a $C_3$ to $C_{10}$ alcohol-based organic solvent.

4. The barrier coating composition according to claim 1, wherein:
  the organic solvent is a solvent system including a $C_3$ to $C_{10}$ alcohol-based organic solvent and a $C_4$ to $C_{12}$ alkane-based organic solvent.

5. A method of forming a photoresist pattern comprising:
  forming a photoresist layer on a substrate;
  forming a barrier coating layer on an upper surface of the photoresist layer, the barrier coating layer including a polymer corresponding to formula I having a weight average molecular weight (Mw) of 5,000 to 100,000 daltons, and an organic solvent, wherein the polymer is expressed by the following formula:

(I)

wherein the expressions (1+m+n)=1; (0.1≦1/(1+m+n))≦0.7; 0.3≦(m/(1+m+n))≦0.9; and 0.0≦(n/(1+m+n))≦0.6 are satisfied;

Rf is selected from a group consisting of $C_1$ to $C_5$ fluorine-substituted hydrocarbon group; and Z is 5-norbornene-2-methanol;

immersing the barrier coating layer in an immersion medium;

transmitting ultraviolet radiation through the immersion medium and the barrier coating layer to form an exposed photoresist layer;

removing the barrier layer; and developing the exposed photoresist layer.

6. The method of forming a photoresist pattern according to claim 5, wherein forming the barrier coating layer comprises:

depositing a quantity of the barrier coating composition on the photoresist layer;

distributing the barrier coating composition across the upper surface of the photoresist layer; and solidifying the distributed barrier coating composition to form the barrier coating layer.

7. The method of forming a photoresist pattern according to claim 6, wherein distributing the barrier coating composition comprises:

spinning the substrate at 500 to 3000 rpm after depositing the quantity of the barrier coating composition on the upper surface of the photoresist layer.

8. The method of forming a photoresist pattern according to claim 6, wherein solidifying the distributed barrier coating composition comprises:

heating the distributed barrier coating to a heat treatment temperature in a range from 95° C. to 120° C.

9. The method of forming a photoresist pattern according to claim 6, wherein removing the barrier layer and developing the exposed photoresist layer comprises;

applying a removing solution to the barrier coating layer for a period sufficient to remove the barrier coating layer; and applying a developing solution to the exposed photoresist layer to develop the photoresist pattern.

10. The method of forming a photoresist pattern according to claim 9, wherein:

removing solution and the developing solution are aqueous alkaline solutions having identical compositions.

11. The method of forming a photoresist pattern according to claim 9, wherein:

the barrier coating layer has a first solubility $S_1$ in the removing solution and a second solubility $S_2$ in the developing solution and the expression $S_1 > S_2$ is satisfied.

12. The method of forming a photoresist pattern according to claim 5, wherein:

the ultraviolet radiation is generated using a light source selected from a group consisting of a KrF excimer laser (248 nm) and an ArF excimer laser (193 nm).

13. The method of forming a photoresist pattern according to claim 6, wherein:

Rf is selected from a group consisting of a perfluorohydrocarbon group and a trifluoromethyl group.

14. The method of forming a photoresist pattern according to claim 6, wherein:

the organic solvent is selected from a group consisting of;

a $C_3$ to $C_{10}$ alcohol-based organic solvent;

a mixture of $C_3$ to $C_{10}$ alcohol-based organic solvents;

a $C_4$ to $C_{12}$ alkane-based organic solvent;

a mixture of $C_4$ to $C_{12}$ alkane-based organic solvents; and a mixture of a $C_3$ to $C_{10}$ alcohol-based organic solvent and a $C_4$ to $C_{12}$ alkane-based organic solvent.

* * * * *